(12) United States Patent
Horne et al.

(10) Patent No.: US 8,063,300 B2
(45) Date of Patent: *Nov. 22, 2011

(54) CONCENTRATOR SOLAR PHOTOVOLTAIC ARRAY WITH COMPACT TAILORED IMAGING POWER UNITS

(75) Inventors: Stephen John Horne, El Granada, CA (US); Gary D. Conley, Saratoga, CA (US)

(73) Assignee: SolFocus, Inc., San Jose, CA (US)

( * ) Notice: Subject to any disclaimer, the term of this patent is extended or adjusted under 35 U.S.C. 154(b) by 1207 days.

This patent is subject to a terminal disclaimer.

(21) Appl. No.: 11/138,666

(22) Filed: May 26, 2005

(65) Prior Publication Data

US 2006/0266408 A1   Nov. 30, 2006

(51) Int. Cl.
- H02N 6/00 (2006.01)
- H01L 31/042 (2006.01)
- F24J 2/00 (2006.01)
- G02B 5/10 (2006.01)

(52) U.S. Cl. .......................... 136/246; 126/569; 359/853

(58) Field of Classification Search .................. 136/246; 126/569; 359/601, 613, 614, 853
See application file for complete search history.

(56) References Cited

U.S. PATENT DOCUMENTS

| | | |
|---|---|---|
| 3,988,166 A | 10/1976 | Beam |
| 4,024,852 A | 5/1977 | L'Esperance et al. |
| 4,078,944 A | 3/1978 | Mlavsky |
| 4,131,485 A | 12/1978 | Meinel et al. |
| 4,150,663 A | 4/1979 | Sisson |
| 4,153,474 A | 5/1979 | Rex |
| 4,177,083 A | 12/1979 | Kennedy |
| 4,187,123 A | 2/1980 | Diggs |
| 4,284,839 A | 8/1981 | Johnson |
| 4,313,024 A * | 1/1982 | Horne ........................ 136/253 |
| 4,444,468 A * | 4/1984 | Mori .......................... 359/853 |

(Continued)

FOREIGN PATENT DOCUMENTS

DE   3205439   8/1983

(Continued)

OTHER PUBLICATIONS

"sunlight." Encyclopædia Britannica. 2010. Encyclopædia Britannica Online. Feb. 27, 2010 <http://www.britannica.com/EBchecked/topic/573973/sunlight>.* Whitfield, G.R. et al., "The Development and Testing of Small Concentrating PV Systems", 1999, Elsevier Science Ltd., Solar Energy vol. 67, Nos. 1-3, pp. 23-34.*

(Continued)

*Primary Examiner* — Basia Ridley
*Assistant Examiner* — Tamir Ayad
(74) *Attorney, Agent, or Firm* — The Mueller Law Office, P.C.

(57) ABSTRACT

Solar panels and assembled arrays thereof include a collection of relatively compact, high-capacity power units. Optical components of each power unit include a front window or surface glazing, a primary mirror, secondary mirror and receiver assembly. Primary and secondary mirrors are defined by respective perimeters, at least a portion of which may be substantially coplanar and in contact with the front window. Some primary mirrors are configured with a perimeter of alternating full and truncated sections, and are curved to a base portion forming a pilot hole therein. Receiver assembly mechanical components include an alignment tube for mating with the primary mirror's pilot hole and for housing a photovoltaic solar cell. A base plate provided adjacent to the alignment tube serves to radiate heat emitted by the solar cell, and in some embodiments an additional heat sink provides further passive cooling. A tapered optical rod also provided within the receiver assembly directs received sunlight to the solar cell where electrical current is generated.

24 Claims, 7 Drawing Sheets

U.S. PATENT DOCUMENTS

| | | | |
|---|---|---|---|
| 4,616,909 A | | 10/1986 | Dane |
| 4,683,348 A | | 7/1987 | Pidgeon et al. |
| 5,062,899 A | * | 11/1991 | Kruer .................... 136/259 |
| 5,153,780 A | | 10/1992 | Jorgensen et al. |
| 5,180,441 A | | 1/1993 | Cornwall et al. |
| 5,344,496 A | | 9/1994 | Stern et al. |
| 5,433,911 A | * | 7/1995 | Ozimek et al. ............... 264/261 |
| 5,505,788 A | | 4/1996 | Dinwoodie |
| 5,538,563 A | | 7/1996 | Finkl |
| 5,659,465 A | | 8/1997 | Flack |
| 5,882,434 A | | 3/1999 | Horne |
| 5,961,739 A | | 10/1999 | Osborne |
| 5,979,834 A | | 11/1999 | Falbel |
| 6,080,927 A | | 6/2000 | Johnson |
| 6,118,067 A | | 9/2000 | Lashley et al. |
| 6,274,508 B1 | | 8/2001 | Jacobsen et al. |
| 6,276,359 B1 | | 8/2001 | Frazier |
| 6,420,266 B1 | | 7/2002 | Smith et al. |
| 6,479,395 B1 | | 11/2002 | Smith et al. |
| 6,527,964 B1 | | 3/2003 | Smith et al. |
| 6,623,579 B1 | | 9/2003 | Smith et al. |
| 6,666,207 B1 | | 12/2003 | Arkas et al. |
| 6,700,055 B2 | | 3/2004 | Barone |
| 6,818,818 B2 | | 11/2004 | Bareis |
| 6,881,893 B1 | | 4/2005 | Cobert |
| 6,895,145 B2 | | 5/2005 | Ho |
| 6,986,591 B2 | | 1/2006 | Pate |
| 7,081,584 B2 | | 7/2006 | Mook |
| 2004/0016454 A1 | | 1/2004 | Murphy et al. |
| 2004/0031517 A1 | | 2/2004 | Bareis |
| 2004/0084077 A1 | | 5/2004 | Aylaian |
| 2004/0140000 A1 | | 7/2004 | Cohen et al. |
| 2004/0254619 A1 | | 12/2004 | Feuermann et al. |
| 2005/0046977 A1 | | 3/2005 | Shifman |
| 2005/0067008 A1 | | 3/2005 | Cobert |
| 2006/0207650 A1 | | 9/2006 | Winston et al. |
| 2006/0231133 A1 | | 10/2006 | Fork et al. |
| 2006/0274439 A1 | | 12/2006 | Gordon et al. |

FOREIGN PATENT DOCUMENTS

| | | |
|---|---|---|
| JP | 2001 274449 | 10/2001 |
| WO | WO 2006 030433 | 3/2006 |

OTHER PUBLICATIONS

Article—*Optical performance at the thermodynamic limit with tailored imaging designs*, Gordon et al., Appl. Opt., vol. 44, 2005, pp. 2327-2331 (16 pages) (in press Dec. 2004).

Article—*A Flat-Plate Concentrator: Micro-Concentrator Design Overview* by Mulligan et al., Photovoltaic Specialists Conference, 2000, Conference Record of the Eighth IEEE, pp. 1495-1497.

Article—*The Promise of Concentrators* by Swanson et al., Progress in Photovoltaics: Research and Applications, vol. 8, Issue 1, 1999, pp. 93-111.

Paper entitled *FLATCON™ and FLASHCON™ Concepts for High Concentration PV* by Bett et al., at the 19th European Photovoltaic Solar Energy Conference, Jun. 7-11, 2004, 4 pages.

Article—*RXI concentrator for 1000X photovoltaic energy conversion* by Alvarez et al., Proc. SPIE, vol. 3781, 1999, pp. 30-37 (9 pages).

Paper entitled *Development of Chip-Size Silicon Solar Cells* by Mulligan et al., Proc.—28th IEEE, PVSC, Sep. 2000, 6 pages.

Presentation entitled *Wafer Level Packaging for Analog/Mixed Signal Applications* by Luu Nguyen at the MEPTEC Int. Wafer Level Packaging Conference, Aug. 22, 2002, 41 pages.

International Search Report for PCT/US06/20588 mailed Feb. 22, 2008—4 pages.

Paper entitled *Realization of high-flux, compact, passively cooled commercial photovoltaic prototypes*, Feuermann, et al., International Solar Concentrator Conference for the Generation of Electricity or Hydrogen, Scottsdale, AZ, May 1-4, 2005, 4 pages.

Abstract of Article—*Comparison of solar concentrators*, A. Rabl, Solar Energy, vol. 18, No. 2, 1976, pp. 930-111.

Abstract of Article—*Erratum To "Solar Fiber-Optic Mini-Dish Concentrators: First Experimental Results And Field Experience"*, Feuermann et al., Solar Energy, vol. 73, Issue 1, Jul. 2002, p. 73.

Abstract of Article—*Exact Optics—II. Exploration of designs on- and off-axis*, Willstrop et al., Monthly Notice of the Royal Astronomical Society, vol. 342, Issue 1, Jun. 2003, pp. 33-49.

Abstract of Article—*High-flux photovoltaic solar concentrators with kaleidoscope-based optical designs*, Ries, et al., Solar Energy, vol. 60, Issue 1, Jan. 1997, pp. 11-16.

Abstract of Article—*High-Flux Solar Concentration with Imaging Designs*, Feuermann et al., Solar Energy, vol. 65, Issue 2, Feb. 1, 1999, pp. 83-89.

Abstracts of Article—*Laser surgical effects with concentrated solar radiation*, Gordon et al., Applied Physics Letters, vol. 81, Issue 4, Sep. 30, 2002, pp. 2653-2655.

Abstract of Article—*New optical systems for the solar generation of nanomaterials*, Gordon et al., Proceedings of the SPIE, vol. 5185, 2004, pp. 99-108.

Abstract of Article—*Optical and thermal analysis of a Cassegrainian solar concentrator*, Mauk et al., Solar Energy, vol. 23, No. 2, 1979, pp. 157-167.

Abstract of Article—*Realization of compact, passively-cooled, high-flux photovoltaic prototypes*, Feuermann, et al., Proceedings of the SPIE, vol. 5942, Aug. 20, 2005.

Abstracts of Article—*Solar fiber-optic mini-dish concentrators: first experimental results and field experience*, Feuermann et al., Solar Energy, vol. 72, Issue 6, Jun. 2002, pp. 459-472.

Abstract of Article—*Solar Fiber-Optic Mini-Dishes: A New Approach To The Efficient Collection Of Sunlight*, Feuermann et al., Solar Energy, vol. 65, Issue 3, Feb. 1, 1999, pp. 159-170.

Abstract of Article—*Taiolred imaging optics for concentration and illumination at the thermodynamic limit*, Gordon et al., Proceedings of SPIE, vol. 5529, Sep. 2004, pp. 130-139.

Article—*Double-tailored Imaging Concentrators*, Ries et al., SPIE, vol. 3781, Jul. 1999, pp. 129-134.

Article—*Exact Optics: A unification of optical telescope design*, D. Lynden Bell, Mon. Not. R. Astron. Soc., vol. 334, 2002, pp. 787-796.

Article—*High-Concentration Photovoltaic Designs Based On Miniature Parabolic Dishes*, Feuermann et al., Solar Energy, vol. 70, No. 5, 2001, pp. 423-430.

Article—*Nonimaging reflectors for efficient uniform illumination*, Gordon et al., Appl. Opt., vol. 31, 1992, pp. 6027-6035.

Article—*Toward ultrahigh-flux photovoltaic concentration*, Gordon et al., Applied Physics Letters, vol. 84, No. 18, May 3, 2004, pp. 3642-3644.

Paper entitled *A 28% Efficient, 200 Wp, 400 X Concentrator Module and Its Packaging Technologies*, Araki et al., presented at the International Solar Concentrator Conference for the Generation of Electricity or Hydrogen in Alice Springs, Australia, Nov. 2003.

Presentation entitled *A 28% Efficient, 400 Sun Concentrator Module and Its Packaging Technologies*, Araki et al., presented at the International Solar Concentrator Conference for the Generation of Electricity or Hydrogen in Alice Springs, Australia, Nov. 2003.

Presentation entitled *Secondary Optics for Solar Concentrators: Concentration, Beam Shaping, and Illumination Uniformity*, Leutz et al., presented at the International Solar Concentrator Conference for the Generation of Electricity or Hydrogen in Alice Springs, Australia, Nov. 2003.

Product Description of OptiCAD® from OptiCAD Corporation, 2000-2006, 1 page.

Gordon et al., U.S. Appl. No. 11/351,314, filed Feb. 9, 2006, Optical System Using Tailored Imaging Designs.

Abstract of DE 3205439.

Abstract of JP 2001-274449.

Belfield, A.J. et al., "Stress in elastic plates reinforce by fibres lying in concentric circles", 1983, Journal of the Mechanics and Physics of Solids, vol. 31, issue 1, abstract.

Office Action for U.S. Appl. No. 11/638,793 mailed Sep. 3, 2010.

Office Action dated Apr. 28, 2011 for U.S. Appl. No. 12/263,462.

* cited by examiner

CONCENTRATOR SOLAR PHOTOVOLTAIC ARRAY WITH COMPACT TAILORED IMAGING POWER UNITS

BACKGROUND OF THE INVENTION

It is generally appreciated that one of many known technologies for generating electrical power involves the harvesting of solar radiation and its conversion into direct current (DC) electricity. Solar power generation has already proven to be a very effective and "environmentally friendly" energy option, and further advances related to this technology continue to increase the appeal of such power generation systems.

A particular type of module utilized in conventional solar systems employs photovoltaics or "PV" cells, in which an electrical field is created at the P-N junction of a silicon wafer or other semiconductive material. PV cells may be configured into modules and arrays that convert impinging solar radiation into electrical power, and can be employed in a wide variety of applications, such as charging batteries, operating motors, powering electrical loads, etc. As a power generation and distribution solution, PV modules can provide an alternative or a supplement to traditional grid-supplied electricity or can serve as a stand-alone source of power in remote regions or other locations where conventional power options may be unavailable or infeasible to implement.

In accordance with the pursuit for further advancement in the field of photovoltaics and related solar generation technologies, it is desired to provide solar panel and array configurations that are increasingly efficient in their conversion levels. In addition to achieving a design that is efficient in both performance and size, it is also desirable to provide power units and corresponding solar panels that are characterized by reduced cost and increased levels of mechanical robustness. Although many PV assemblies and related solar systems have been developed, no single design has captured the above preferences and others associated with the present subject matter. A better appreciation of the aspects and advantages of the presently disclosed technology will be attained from the remainder of the specification.

SUMMARY OF THE INVENTION

In view of the recognized features encountered in the prior art and addressed by the present subject matter, new features and steps associated with solar system technology have been developed. More particularly, exemplary power units such as those including a photovoltaic (PV) cell have been developed, as well as modular configurations of such power units into solar panels and corresponding arrays. The power units and collective assemblies thereof are characterized by many particular features and advantages, several of which will now be discussed.

Many embodiments of the presently disclosed technology provide for a power unit design that is axially compact (such as less than about 20 cm in some embodiments). Reduced dimensions and cost as well as relative ease of assembly are some of the many advantages afforded by select embodiments of the presently disclosed technology.

Yet another advantage in accordance with certain embodiments of the present invention concerns the completely passive cooling options offered in each power unit design. The concentrator assembly of each power unit is positioned at the back of each power unit, thus providing it in a location that can be readily cooled. Concentrator units may include a heat spreading element consisting of a relatively large base plate that functions as a simple heat spreader and serves to provide certain mechanical functionality for the assembly as well to radiate heat emitted by the concentrator assembly's solar cell. In some embodiments, an additional heat sink element may also be provided adjacent to each solar cell for further passive cooling.

A still further advantage of some embodiments of the present technology concerns the relatively liberal optical tolerances that are a result of the precise design and configuration of optical components in each power unit. The size and position of primary and secondary mirrors relative to one another and relative to an optical rod in each concentrator assembly yields an arrangement in which received sunlight can be concentrated to a given focal point with some degree of flexibility and potential misalignment.

Exemplary embodiments of the present invention also offer optimized combinations of mechanical rigidity and panel area efficiency. Primary mirror shapes and arrangements are presented that minimize structural weakness along a front panel surface while also ensuring that a maximum amount of space is available for exposure to potential sunlight. One particular exemplary embodiment employs near-hexagonal shaped primary mirrors that are collectively arranged in a honeycomb array that provides a strong and relatively lightweight configuration that is potentially frameless and is characterized by high levels of panel efficiency.

Different embodiments for selectively achieving the above exemplary advantages will now be discussed. In one exemplary embodiment of the present invention, a power unit includes several optical components, such as a substantially planar surface (i.e., a front window), a curved primary mirror and a secondary mirror. The curved primary mirror has a first perimeter formed in a radially symmetric fashion about a first axis, wherein at least a portion of the first perimeter is provided in contact with the substantially planar surface. The secondary mirror has a second perimeter formed in a radially symmetric fashion about a second axis, wherein at least a portion of the second perimeter is also provided in contact with the substantially planar surface. The first and second axes are substantially coaxial. In some embodiments, the first and second perimeters are substantially coplanar and are sometimes both circular.

In some more particular embodiments of the above exemplary power unit, the first and second perimeters are characterized by respective first and second diameters, where the first diameter is sufficiently larger than the second diameter. In some embodiments, the first and second mirrors may be radially symmetric about a single axis that is substantially perpendicular to the substantially planar surface. In other embodiments, the first perimeter is defined by n full sections and n truncated sections provided in an alternating fashion, where n is an integer number between three and nine. The full sections of such a perimeter are provided in contact with and/or are attached to the substantially planar surface, and in some cases mounting tabs may be provided at each full section to provide additional surface area for such attachment. Each truncated section of the primary mirror's first perimeter forms an arc that extends away from the substantially planar surface, wherein the arc exists in a plane that is substantially perpendicular to the substantially planar surface.

Another exemplary embodiment of the present subject matter corresponds to a solar panel that includes a plurality of power units, such as those described above. Each power unit includes a respective primary and secondary mirror and a receiver assembly. Various exemplary shapes and arrangements of the mirrors may be as previously described, with primary mirrors of adjacent power units selectively provided in contact with one another. More particularly, when a primary mirror perimeter is defined by n full sections (for contact/attachment to a front window) and n truncated sections (respectively formed in an arc away from the front window and in a plane perpendicular to a front window), at least two truncated sections of each primary mirror are respectively provided adjacent to a truncated section of another adjacently positioned primary mirror. In some embodiments, a single power unit is surrounded by n other power units such that each of the n truncated sections partially defining the primary mirror's first perimeter of that single power unit is adjacent to a truncated section of one of the n other power units. In more particular exemplary embodiments, the receiver assembly of each power unit may selectively include such components as an alignment feature, an optical rod and a photovoltaic cell. An alignment feature may be used in combination with optional mounting rings to guide and position the receiver assembly relative to a pilot hole formed in each primary mirror. An optical rod may be configured to receive sunlight from a power unit's corresponding secondary mirror, and direct it to a photovoltaic cell provided at the base of the optical rod.

Yet another exemplary embodiment of the present subject matter concerns a power unit including such elements as a primary mirror and a receiver assembly. The primary mirror may be formed to define a pilot hole at the base thereof and then curve out from the pilot hole to a first perimeter portion. The receiver assembly may include an alignment element for mating with the pilot hole of the primary mirror as well as a solar cell configured to receive sunlight directed to the receiver assembly and to generate a resultant electrical current flow therein. In more particular embodiments, the receiver assembly may also include a base plate provided adjacent to the alignment element to radiate heat emitted by the solar cell (which may be mounted within the alignment element). In some embodiments, the base plate may be provided in a substantially flat and planar configuration. In other embodiments, the base plate may correspond to a spring plate that provides a flexible support mechanism by being formed with a series of substantially concentric circular portions therein. The receiver assembly may also include a substrate for mounting the solar cell and for providing electrical connections for relaying the electrical current generated in the solar cell. A heat sink may also be provided at the base of the solar cell to further dissipate heat. Some receiver assemblies may include an optical rod, which may be tapered in some embodiments and configured for receiving and guiding sunlight to the solar cell. Still further embodiments selectively include such elements as a front window provided adjacent to and adhered to at least a portion of the primary mirror's first perimeter, a secondary mirror provided in contact with a front window and positioned relative to the primary mirror's pilot hole, and/or a housing for receiving select edges of the front window.

A still further exemplary embodiment of the present invention may relate to a solar array including at least one panel (e.g., four panels in some embodiments) of power units provided in a substantially planar and adjacent relationship with one another and also a motorized assembly. Each power unit includes a primary mirror, secondary mirror and receiver assembly. Primary mirrors may be provided in a variety of shapes, such as but not limited to a circular, near-square or near-hexagonal shape. The motorized assembly is coupled to the at least one panel and is configured for orienting the panel relative to a direction of applied sunlight. The receiver assembly of each power unit may selectively include one or more of the previously described exemplary components. The solar array may also include such additional elements as a mounting pole, a microcontroller for storing data corresponding to the desired direction of orientation of the panel at different times during the day, a communication link for receiving data from a locally linked computing device or from a networked remote device and a sun sensor for receiving sunlight and providing additional information regarding the desired direction of orientation.

The accompanying drawings, which are incorporated in and constitute a part of this specification, illustrate one or more embodiments of the present subject matter, and together with the description serve to explain certain principles of the disclosed technology. Additional embodiments of the present subject matter may incorporate various steps or features of the above-referenced embodiments, and the scope of the presently disclosed technology should in no way be limited to any particular embodiment. Additional objects, features and aspects of the present subject matter and corresponding embodiments are discussed in greater detail below.

BRIEF DESCRIPTION OF THE DRAWINGS

A full and enabling disclosure of the present subject matter, including the best mode thereof, directed to one of ordinary skill in the art, is set forth in the specification, which makes reference to the appended drawings, in which.

Repeat use of reference characters in the present specification and drawings is intended to represent same or analogous features or elements of the present subject matter.

DETAILED DESCRIPTION OF EXEMPLARY EMBODIMENTS

Reference will now be made in detail to presently preferred embodiments of the disclosed technology, one or more examples of which are illustrated in the accompanying drawings. Each example is provided by way of explanation of the present technology, not limitation of the present technology. In fact, it will be apparent to those skilled in the art that modifications and variations can be made in the present technology without departing from the spirit and scope thereof. For instance, features illustrated or described as part of one embodiment may be used on another embodiment to yield a still further embodiment. Thus, it is intended that the present subject matter covers such modifications and variations as come within the scope of the appended claims and their equivalents.

Figure 1:
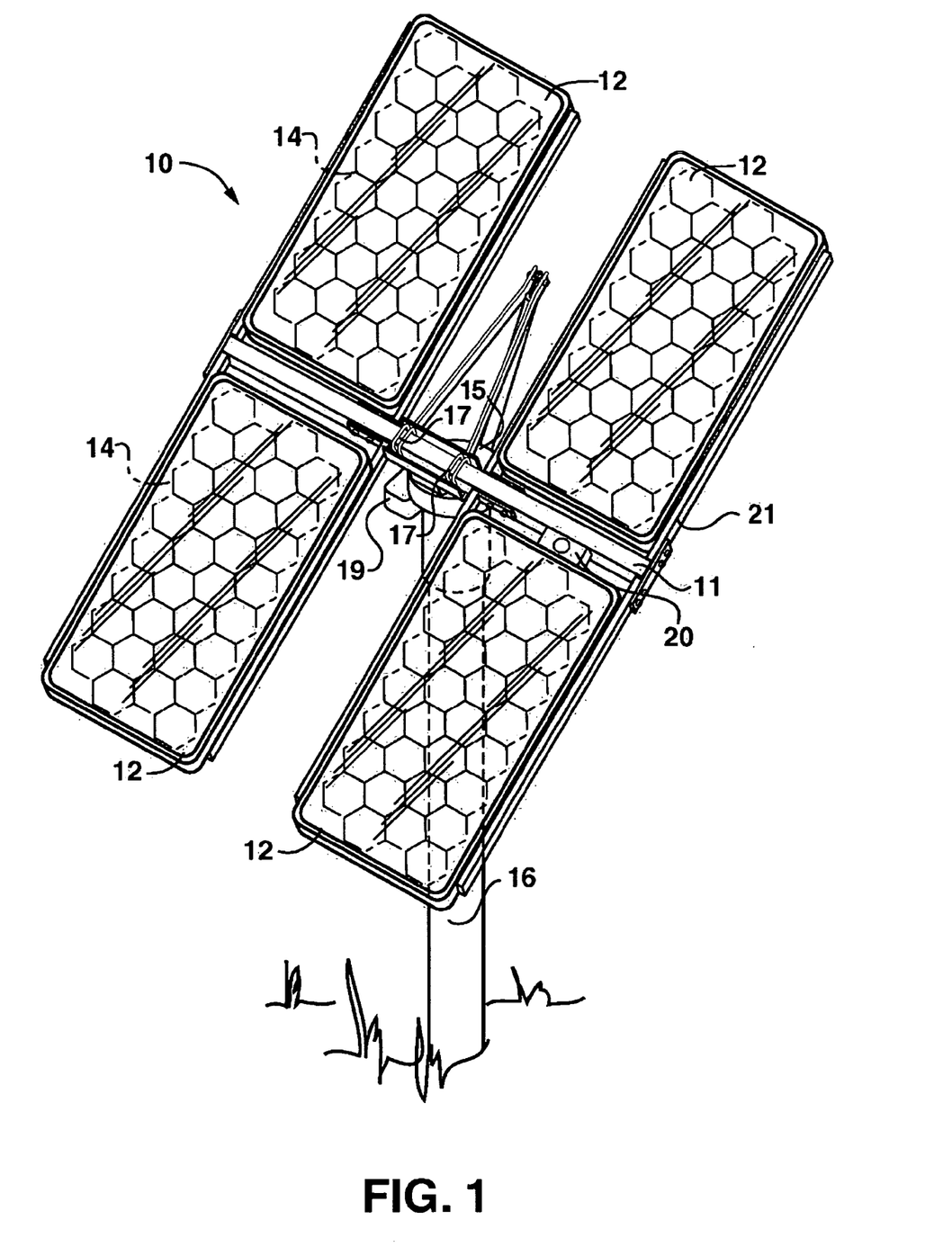
FIG. 1 provides a perspective illustration of an exemplary array embodiment in accordance with aspects of the present invention, including multiple solar panels provided in a pole-mounted configuration.

With reference to FIG. 1, a basic unit in accordance with certain aspects of the presently disclosed technology corresponds to an array 10 that includes a plurality of solar panels 12 provided in a substantially planar configuration. In the example of FIG. 1, four solar panels 12 collectively form array 10, but it should be appreciated that any number of solar panels may be employed, from a single solar panel to many more than four panels. Each panel 12 houses a matrix of power units 14 that convert sunlight, or solar radiation, to electricity. In the exemplary illustration of FIG. 1, thirty-two power units 14 are shown in each solar panel 12, although this depiction should not be unnecessarily limiting to the present subject matter. A fewer or greater number of power units may be provided in each solar panel, and such power units may be provided in a variety of particular configurations. Each power unit has a mechanical arrangement which focuses solar energy to an optical rod, which conducts it to a single photovoltaic (PV) cell. These and other particular aspects of the power units will be described later in more detail.

In one embodiment, each panel 12 of array 10 measures approximately one meter by two meters and is provided with a relatively compact depth of about 10 cm, due in part to the efficiency of the optical components of each power unit. A collective assembly of four panels as depicted in FIG. 1 may form a substantially rectangular shape measuring about 2.25 meters by 4.25 meters and also characterized by a depth of 10 cm. A depth of between about two and thirty cm is generally provided in some of the disclosed exemplary embodiments. These dimensions are provided for example only and should not be limiting to the present subject matter.

In one exemplary embodiment, there are two outputs per panel, each rated at approximately 48V and 5.3 A, resulting in a peak power output for one panel 12 of approximately 500 W, representing about 25% panel efficiency under maximum direct sun. Such exemplary panel outputs can be connected at mounting pole 16 or some other collection point to provide a single output of 384 V, 5.3 A DC, corresponding to about 2 kW for a four-panel array 10. An electricity generator utilizing the presently disclosed technology may be used quite effectively when large numbers of arrays are grouped together on top of large buildings or ground mounted, to produce medium to large amounts of power. In one embodiment, an aggregation of arrays into banks of twenty arrays each provides 7.78 kV and 5.3 A per bank to a grid intertie point. For fields of less than 41 kW, accommodation of a smaller voltage may be arranged.

The array 10 of FIG. 1 is positioned atop a mounting pole 16, which in some embodiments may be about 2.5 meters tall. A structural frame 21 is provided along the array 10 to help maintain planarity and rigidity of the assembly. Structural frame 21 is connected to a torque bar 11 that serves to rotate the assembly of solar panels 12 about its center in two axes: a front-back axis and a left-right axis. A motorized gear drive assembly 15 provided at the top of mounting pole 16 is coupled to torque bar 11 via pivot point connections 17. Gear drive assembly 15 is also coupled to a controller 19, which may correspond to a microcontroller in some embodiments. Gear drive assembly 15, controller 19, torque bar 11 and mounting pole 16 all combine to form a tracker for the solar panel array.

The tracker components illustrated in FIG. 1 collectively function to orient the respective power units 14 in optimum direction for receiving sunlight such that the PV cells therein can operate most effectively. The motorized gear assembly 15 is operated by controller 19 based on input received from a narrow range sun sensor 20 that provides accurate pointing information. In one embodiment, sun sensor 20 operates over a range of about five degrees, and is used to zero array 10 to the sun for large pointing errors. In some embodiments, sun sensor 20 is not required, such as instances where the array is generally positioned within the capture angle of certain optical components of the power units.

An array 10 such as illustrated in FIG. 1 is designed for relatively easy installation and subsequent operation in a mostly unattended state, making it especially ideal for operation in remote areas. Each array 10 can be configured to monitor its own health and efficiency, local weather conditions, and other predetermined parameters. In some embodiments, monitoring and control may be locally implemented, such as via a communication link to a PDA or other handheld computing device provided with GPS capabilities. Alternatively, monitoring and control of array 10 may be effected remotely, such as via a communication link to the Internet. Further, a camera may be mounted and web cast to allow remote viewing of the system(s). In some embodiments, local control will disable remote control, but the telemetry features of the array can still be viewed remotely even during manual control operations. The system controls of array 10 can be configured to post an alarm or take itself offline if a problem occurs. In addition, automatic calibration features that may be run on a periodic basis to maximize power output may also be provided. Telemetry data indicating where the array 10 should be positioned throughout the day can be downloaded or provided and stored in memory associated with microcontroller 19. A calibration procedure may also be utilized to determine the orientation of the array to the sun that produces maximum power output. When sunlight is not available to the array 10, such as during night or in inclement weather conditions, array 10 may be positioned upside down, generally parallel to the ground. Such a position will offer the least wind resistance and also reduces exposure of the front surface of array 10 to dust and secretions, thus minimizing the need for washing.

It should be appreciated that many other array and tracker configurations are applicable for use with the presently disclosed technology, including but not limited to ganged arrays of panels for a low profile roof mount application. Such arrays could be equatorial mounted and polar aligned so as to allow near-single axis tracking. These too could be configured to park in a downward facing position each evening or during other predetermined conditions to minimize environmental particulate accumulation and to afford further protection to the system.

Figure 6:
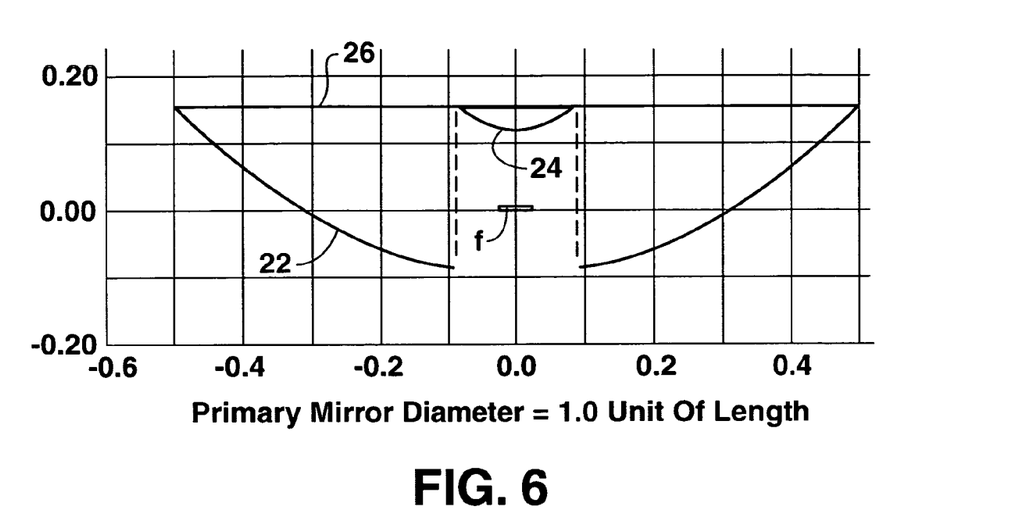
FIG. 6 provides a graphical view of exemplary size relationships among cross-sectional representations of the primary mirror, secondary mirror and focal plane components of a power unit in accordance with aspects of the present invention.

Referring now to FIG. 6, select exemplary optical components of each power unit will now be described. Certain aspects of the optical components are tailored for maximum efficiency under imaging optics theory. The main optical elements of each power unit 14 are a primary mirror 22, a secondary mirror 24, a protective front surface 26, such as a window or cover glazing, and a receiver assembly defining a nominal focal plane (f). As depicted in the cross-sectional view of such elements in FIG. 6, the primary and secondary mirror contours are tailored to eliminate all zeroth and first-order aberrations (aplanatic), thereby allowing the attainment of high flux at high collection efficiency. Protective front surface 26 is a substantially planar surface, such as a window or other glazed covering, that provides structural integrity for a power unit and protection for other components thereof.

FIG. 6 also provides a general exemplary representation of the size of the main optical components relative to one another. As can be seen, the diameter of the primary mirror is about five times that of the secondary mirror, and in some embodiments is greater than about four times that of the secondary mirror. In another example, it can be noted that the area of the primary mirror shaded by the secondary mirror is about 3.2%. A receiver assembly (see FIG. 7) defining focal plane (f) typically includes a tapered optical rod (to be discussed later in more detail) to extract and further concentrate impinging sunlight onto a solar cell that resides just behind the apex of primary mirror 22. The configuration of optical components generally described in FIG. 6 yields an axially compact design that can be easily cooled since the solar cell of the receiver assembly is provided at the rear of the unit.

Figure 7:
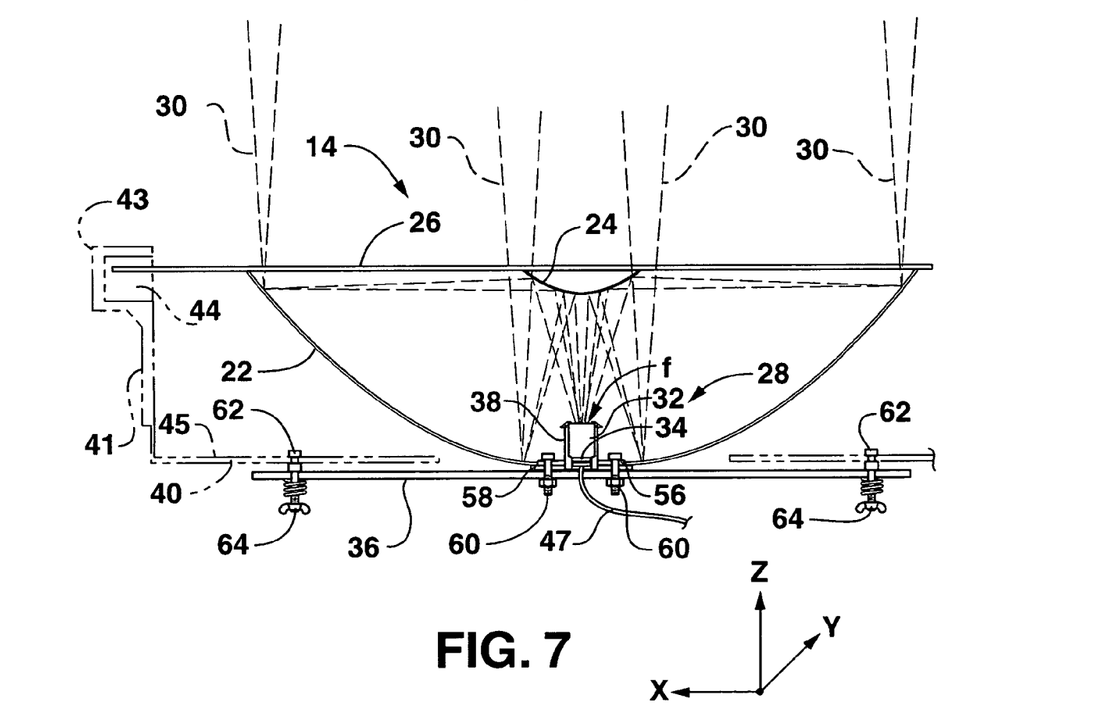
FIG. 7 provides a detailed cross-sectional view of a power unit embodiment in accordance with aspects of the present invention, including the respective optical components, receiver assembly and housing components thereof.

Referring now to FIG. 7, another cross-sectional view is provided of the optical as well as select mechanical components of an exemplary power unit in accordance with embodiments of the present invention. Sunlight, represented by the dashed-line ray traces 30, enters the power unit 14 through a substantially planar front window 26. The concave surface of primary mirror 22 then reflects a majority of the received sunlight to the convex surface of secondary mirror 24, where it is further reflected to a focal point (f). Focal point (f) can be generally defined as the central portion or upper surface of an optical rod 32 or a point at or beyond the apex of the primary mirror. Optical rod 32 may be tapered in some embodiments away from the focal point (f) and employs total internal reflectance to provide optimal transmission of the solar flux towards a solar cell 34. The configuration of the optical components in FIG. 7 yields a sufficiently high exit numerical aperture that can tolerate sufficient mechanical misalignment. By providing optical rod 32 with a sufficiently wide entrance diameter, the focal point of concentrated sunlight can wander around the rod surface with some degree of flexibility and still be collected at a solar cell 34 provided at the base of optical rod 32. An upper surface defining the entrance for optical rod 32 may also be provided with an antireflective coating to reduce Fresnel reflection losses. The inside and outside surfaces of the front window, as well as select portions of the optical rod, may be subjected to any type of anti-reflection treatment, such as but not limited to a nano-coating material, to increase optical efficiency over a generally wide solar spectrum.

Referring still to FIG. 7, the primary mirror 22 and secondary mirror 24 are both illustrated as curved elements, although it should be appreciated that a substantially flat secondary mirror may be utilized in some embodiments. In one embodiment, primary mirror 22 is a second surface mirror using silver, and slump-formed from soda-lime glass. The utilization of silver in primary mirror 22 helps to accommodate a desired spectral response to the ultraviolet levels of light harvested by the solar cell 34 in collector assembly 28. Primary mirror 22 may weigh approximately 500 grams in one exemplary embodiment. Secondary mirror 24 is a first surface mirror using silver and a passivation layer, approximately 50 mm in diameter, formed on a substrate of soda-lime glass. Secondary mirror 24 may weigh approximately 45 grams in one exemplary embodiment. The respective perimeters of the first and second mirrors 22, 24 may be formed to define a variety of different shapes, although it should be appreciated that at least a portion of the perimeter of first mirror 22 and the perimeter of second mirror 24 is provided in contact with the inside surface of front window 26. The portions of primary mirror 22 and secondary mirror 24 that are in contact with front window 26 may be physically attached thereto by one of many attachment means, such as but not limited to compression, welding or an adhesive bonding. In some embodiments, primary mirror 22 and secondary mirror 24 may each be radially symmetric about an axis running through the centers of both mirrors and generally perpendicular to the front window 26.

The perimeter of each primary mirror 22 may be formed in a variety of different fashions, and select exemplary embodiments depicting several options will now be presented and discussed with reference to FIGS. 3A-5B, respectively. In a first embodiment, such as illustrated in the plan view of FIG. 4A and the perspective view of FIG. 4B, the perimeter of primary mirror 22b is formed in a generally circular configuration. With a generally circular configuration, the entire perimeter of the primary mirror 22b may be substantially coplanar with the perimeter of secondary mirror 24 and both circular perimeters may be in contact with and/or adhered to the inner surface of front window 26. In one particular embodiment of the disclosed technology, the perimeter of generally circular primary mirror 22b is formed with an exemplary diameter 60 of about 280 mm, the perimeter of generally circular secondary mirror 24 is formed with an exemplary diameter 62 of about 50 mm, and the depth 64 of primary mirror 22b (see FIG. 4B) is formed to be about 70 mm.

Figure 2:
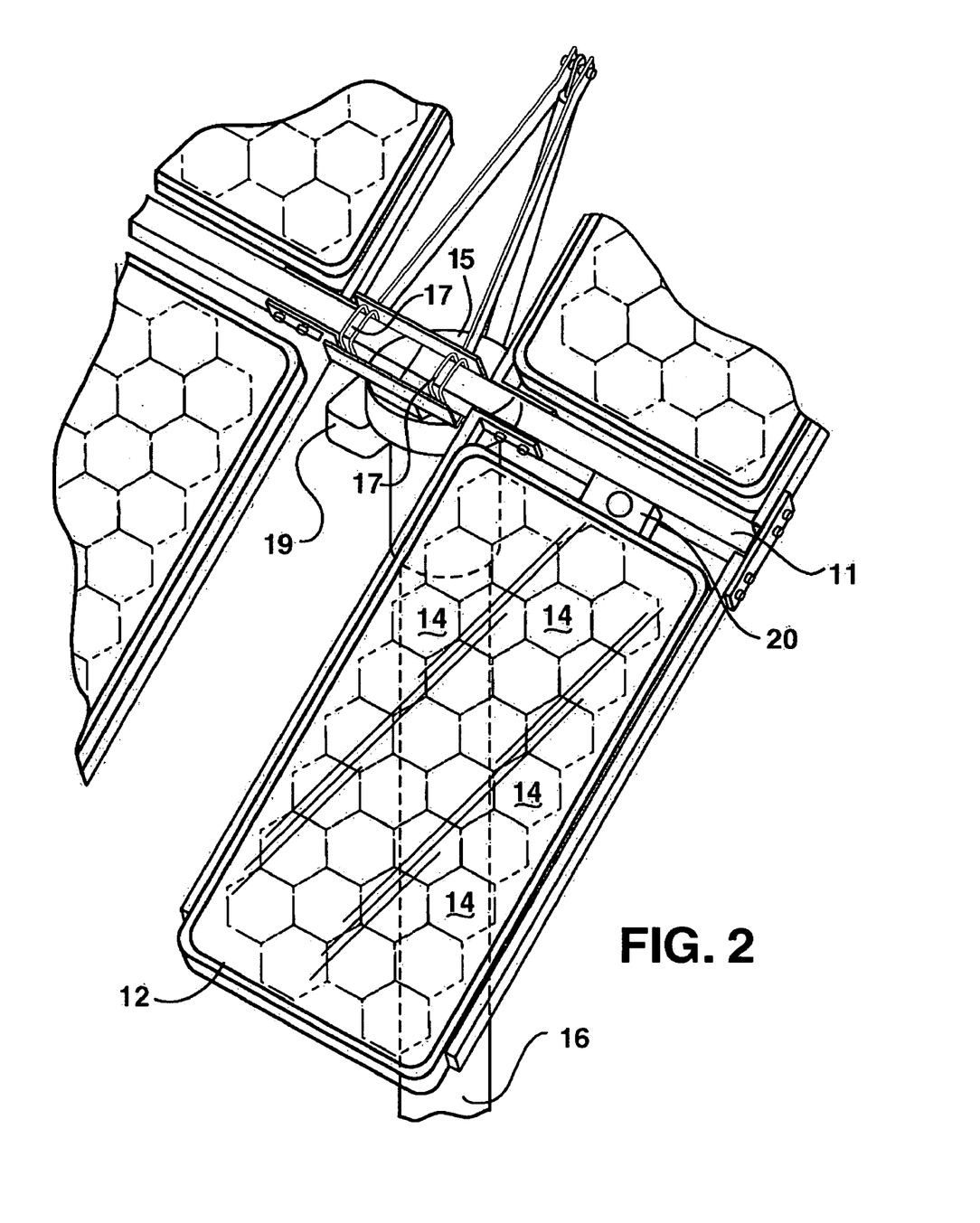
FIG. 2 provides a detailed perspective view of one exemplary solar panel from the array of FIG. 1, including a representation of a close-packed configuration of multiple power units within the solar panel.
Figures 3A, 4A:
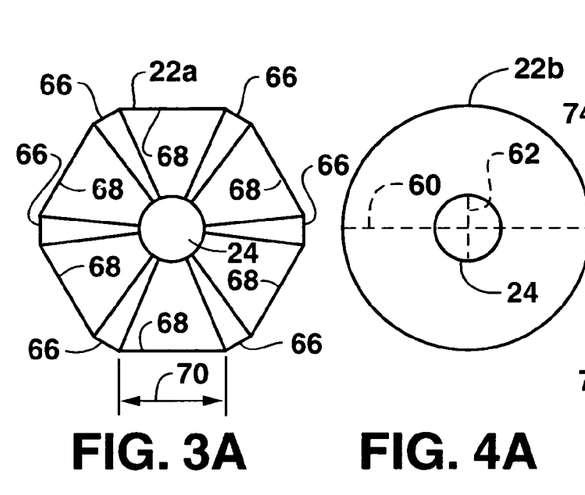
FIG. 3A provides a plan view of an exemplary primary and secondary mirror configuration for use in accordance with a power unit of the present invention, particularly illustrating an exemplary near-hexagonal primary mirror design.
FIG. 4A provides a plan view of an exemplary primary and secondary mirror configuration for use in accordance with a power unit of the present invention, particularly illustrating an exemplary circular primary mirror design.
Figure 3B:
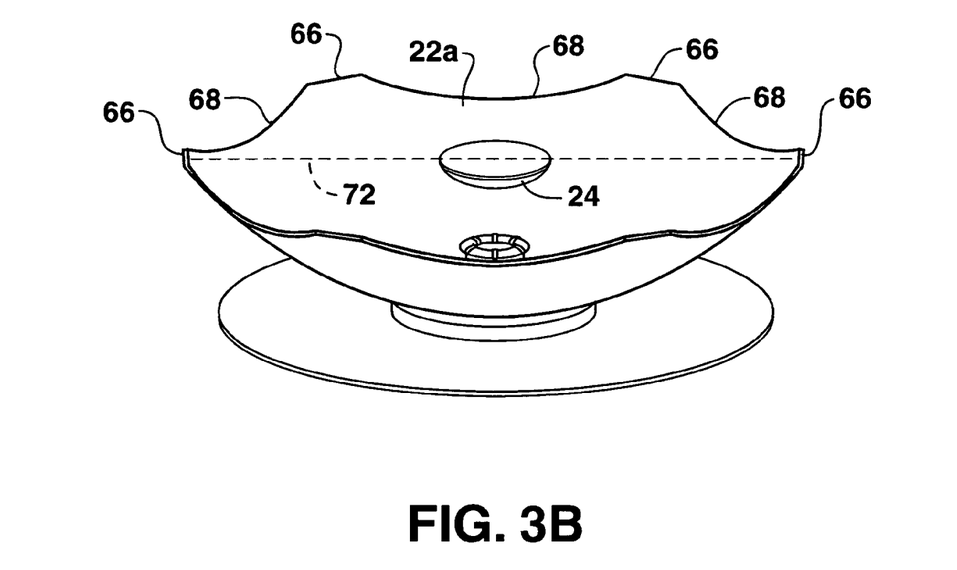
FIG. 3B provides a perspective view of an exemplary power unit embodiment in accordance with aspects of the present invention, including a near-hexagonal shaped primary mirror such as also depicted in FIG. 3A.
Figure 4B:
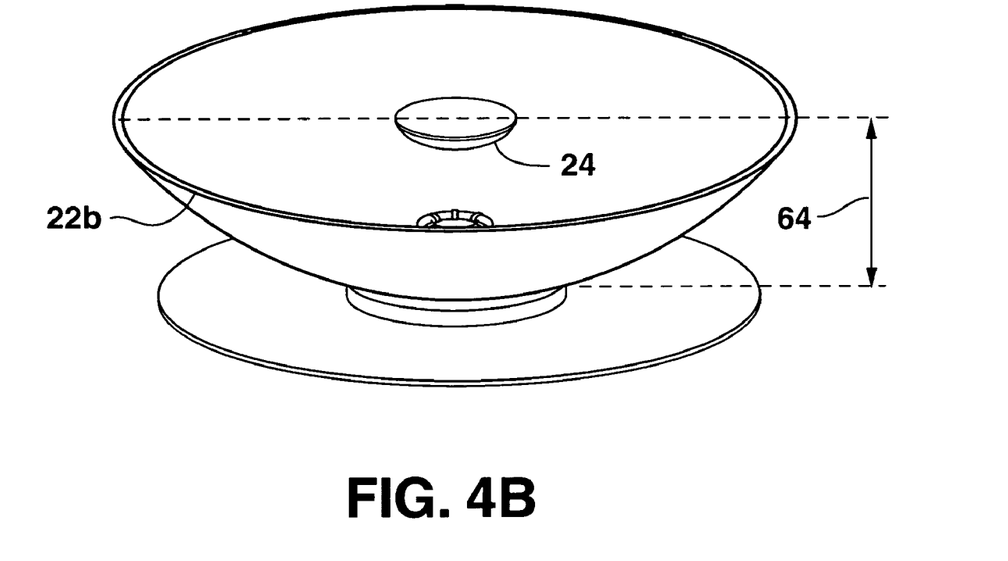
FIG. 4B provides a perspective view of an exemplary power unit embodiment in accordance with aspects of the present invention, including a circular-shaped primary mirror such as also depicted in FIG. 4A.

A second embodiment depicting an exemplary shape for primary mirror 22 is provided in the plan view of FIG. 3A and perspective view of FIG. 3B, in which the perimeter of primary mirror 22a is formed in a near-hexagonal fashion. The perimeter of primary mirror 22a is defined by six full sections 66 and six truncated sections 68. Full sections 66 are substantially coplanar with one another such that they may be provided in contact with and/or adhered to the inner surface of front window 26. The distance 70 measured in a straight line from the edge of adjacent full sections 66 is about 132 mm in one exemplary embodiment of the present technology. The distance 72 measured across the diameter of the perimeter of primary mirror 22a may be about 300 mm in one exemplary embodiment. Each truncated section 68 of the perimeter of primary mirror 22a is formed to define a generally arched segment that extends away from front window 26. Each truncated section 68 exists in a respective vertical plane that is substantially perpendicular to front window 26. Selected truncated sections 68 of each primary mirror 22a may be provided in contact with and/or adhered to a matched truncated section of an adjacent power unit's primary mirror. This matching of adjacent truncated sections 68 can be visualized in the illustration of FIG. 2, where the primary mirror of each power unit 14 is provided adjacent to a portion of at least two other primary mirrors.

Figure 5A:
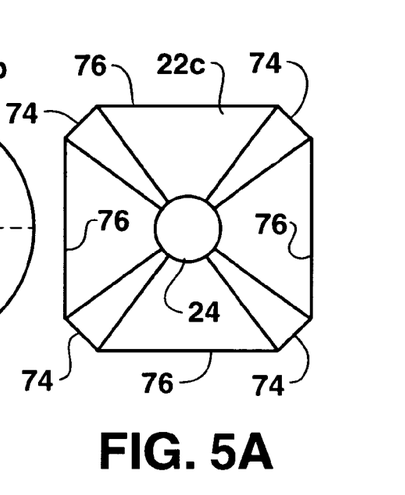
FIG. 5A provides a plan view of an exemplary primary and secondary mirror configuration for use in accordance with a power unit of the present invention, particularly illustrating an exemplary near-square primary mirror design.
Figure 5B:
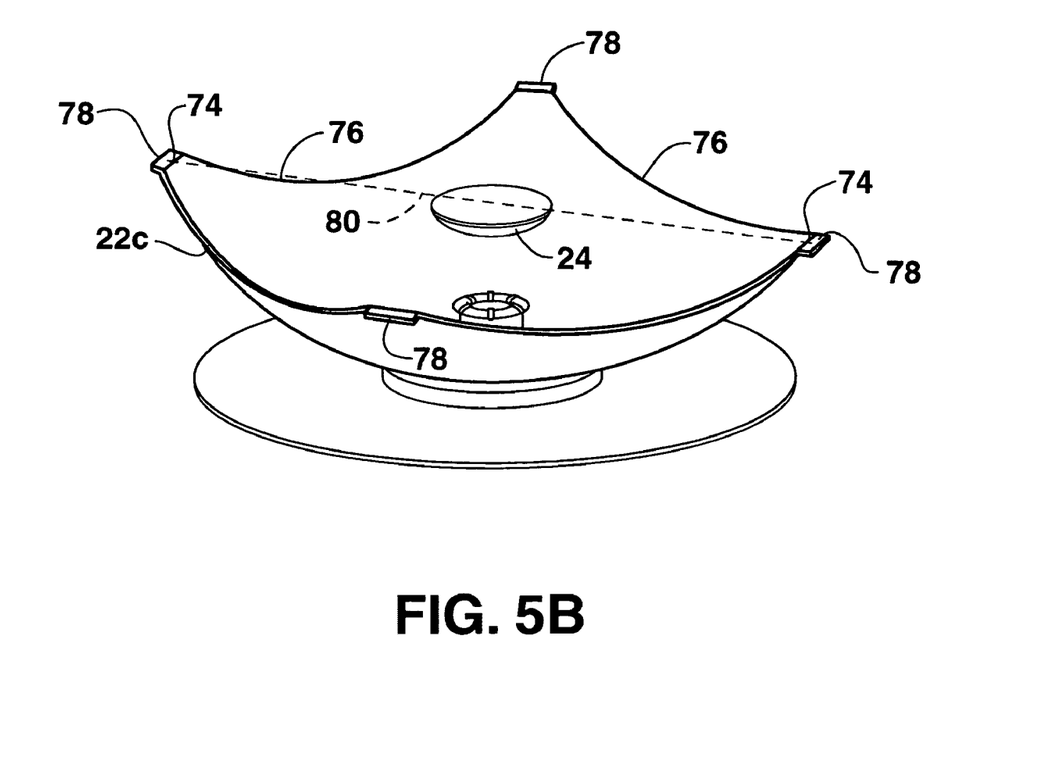
FIG. 5B provides a perspective view of an exemplary power unit embodiment in accordance with aspects of the present invention, including a near-square shaped primary mirror such as also depicted in FIG. 5A.

A third embodiment depicting an exemplary shape for primary mirror 22 is provided in the plan view of FIG. 5A and the perspective view of FIG. 5B, in which the perimeter of primary mirror 22c is formed in a near-square configuration. The perimeter of primary mirror 22c is defined by four full sections 74 and four truncated sections 76. Full sections 74 are substantially coplanar with one another such that they may be provided in contact with and/or adhered to the inner surface of front window 26, while each truncated section 76 exists in a respective plane that is substantially perpendicular to front window 26 when the primary mirror is adjacent thereto. The distance 80 measured across the perimeter of primary mirror 22c may be about 250 mm in one exemplary embodiment.

It should be appreciated in some embodiments of the disclosed technology that the respective perimeters (or portions thereof) of the primary and secondary mirrors may not be precisely arranged in a coplanar fashion. Effective operation of a power unit may still be achieved with a slightly staggered arrangement along the coaxial alignment of primary and secondary mirrors within a predetermined limit.

Referring to FIG. 5B, substantially flat mounting tabs 78 may be provided for each full section 74 to further facilitate provision of a sufficient mating area for contact with or adherence to front window 26. Dimensions for each mounting tab 78 may be about 1.5 mm by about 5.0 mm in one exemplary embodiment. It should be further appreciated that mounting tabs (such as tabs 78 illustrated in FIG. 5B) may be utilized with a primary mirror perimeter of any shape and size when it is desired to increase the amount of surface area for adhesion to front surface 26. For example, such tabs may be used at each full section 66 in the near-hexagonal configuration of FIGS. 3A and 3B even though it is not illustrated.

It should be appreciated that although FIGS. 3A-5B, respectively, depict only three exemplary embodiments for the shape of primary mirror 22, many other options may be employed in accordance with the present invention. For example, the perimeter of primary mirror 22 may be formed as any near-polygonal shape defined by n full sections and n truncated sections, where n is an integer number generally within a range of between three and nine. As with the above examples, each of the full sections in such embodiments is typically in contact with and/or adhered to the inner surface of a front window. Each truncated section is formed as a circular arc that extends away from the front window and that exists in a respective plane that is substantially perpendicular to the front window. Each truncated section may be in contact with and/or adhered to a truncated section of an adjacent power unit's primary mirror.

It should be appreciated by one of ordinary skill in the art that the decision of what shape to use for the perimeter of primary mirror 22 is often dependent on a tradeoff between panel area efficiency and mechanical rigidity. A panel having primary mirrors formed in a near-square configuration (such as represented in FIGS. 5A and 5B) may be a good choice for embodiments in which the panel area is to be most efficiently utilized. In such configurations and others, one or more stiffening beams may be provided across the front window 26 in order to improve device rigidity. It should be appreciated that the more features added to increase rigidity such as front support beams could shade some sunlight from entering the power units. With reference to FIG. 2, a panel configuration of near-hexagonal power units (such as individually represented in FIGS. 3A and 3B) are capable of providing a good amount of panel area efficiency, while also providing a structure that is uniformly quite rigid in all directions since there are no lines of weakness running across a given panel surface.

Referring again to FIG. 7, the receiver assembly 28 of the exemplary power unit 14 will now be discussed. A photovoltaic (PV) solar cell 34 is mounted inside a cell module that includes a base plate 36 and an alignment tube 38. Alignment tube 38 may be formed of aluminum or copper in some embodiments. Alignment tube 38 is surrounded by first and second concentrically aligned and generally circular mounting rings 56 and 58 that are connected to base plate 36 by bolts 60. In some embodiments, mounting ring 58 is characterized by a slightly larger diameter than that of mounting ring 56. Mounting rings 56, 58 may correspond to metal washers in some particular exemplary embodiments. Tapered optical rod 32 is also located by the alignment tube 38, and is glued or adhered by other means to the PV cell 34. In one exemplary embodiment, optical rod 32 is ground and molded from Corning BK7 borosilicate glass. In other exemplary embodiments, optical rod 32 is molded from acrylic or polyolephin. An anti-reflection coating accommodating a relatively wide bandwidth may be provided on the entrance surface of optical rod 32.

The removable receiver assembly 28 is installed by orienting alignment tube 38 in the X-Y plane (as depicted by the directional legend of FIG. 7, where the Y vector is generally perpendicular to the X-Z plane) such that fits through a pilot hole formed in primary mirror 22. A shoulder is formed by mounting rings 56 and 58 to contact the bottom surface of primary mirror 22, thus aligning itself in a direction defined by the Z axis of FIG. 7. The base plate 36 of receiver assembly 28 is loaded against front window 26 and primary mirror 22 by coil springs 62. Wing nuts 64 are used to fasten the coil springs 62 relative to housing 40. Front window 26 is sealed to housing 40 with an extruded rubber gasket 44, in a fashion similar to the attachment of a car windshield, or by other suitable connection sealing means. The housing 40 with the mounted cell modules and front window 26 are held flat and rigid with the tines of the tracker frame 21 (as shown in FIG. 1).

Housing 40 may be built from more than one piece of material, such as but not limited to stamped metal or polyethylene terepthalate (PET) and is designed to accommodate the total number of power units provided in a given solar panel. The sides 41 of housing 40 (only one of four sides being illustrated in FIG. 7) may all be formed from a single manufacturing stamping process on a first piece of material and will contain a lip 43 on the top edge of sides 41 that allows the front surface glass 26 to be mounted. There may be an overlap between front window 26 and the mounting lip 43 so that the force from the spring loaded primary mirrors is transferred evenly to housing 40. Beads may be stamped into each face of housing 40 to aid in rigidity of the structure. The backing 45 of housing 40 may be separately formed from a second piece of material that can be bolted, screwed or connected in some other fashion to the sides 41 of housing 40. Backing 45 may be formed with enough receiver assembly mount points stamped into it to accommodate the total number of power units per panel (e.g., thirty-two units in the exemplary embodiment of FIGS. 1 and 2). In some embodiments, backing 45 may be made of a metallic material. In other embodiments, such as when the respective base plates 36 of each power unit in a solar panel are utilized as the positive output for each solar cell, backing 45 may be made of an insulative material such as fiberglass, plastic, or a polymer coated metal.

A weather-proof junction box (not shown) may be provided at the exterior of backing 45 to house the power outputs 47 from each cell, enclose any needed bypass diodes and allow external power lines to be connected.

Figure 8A:
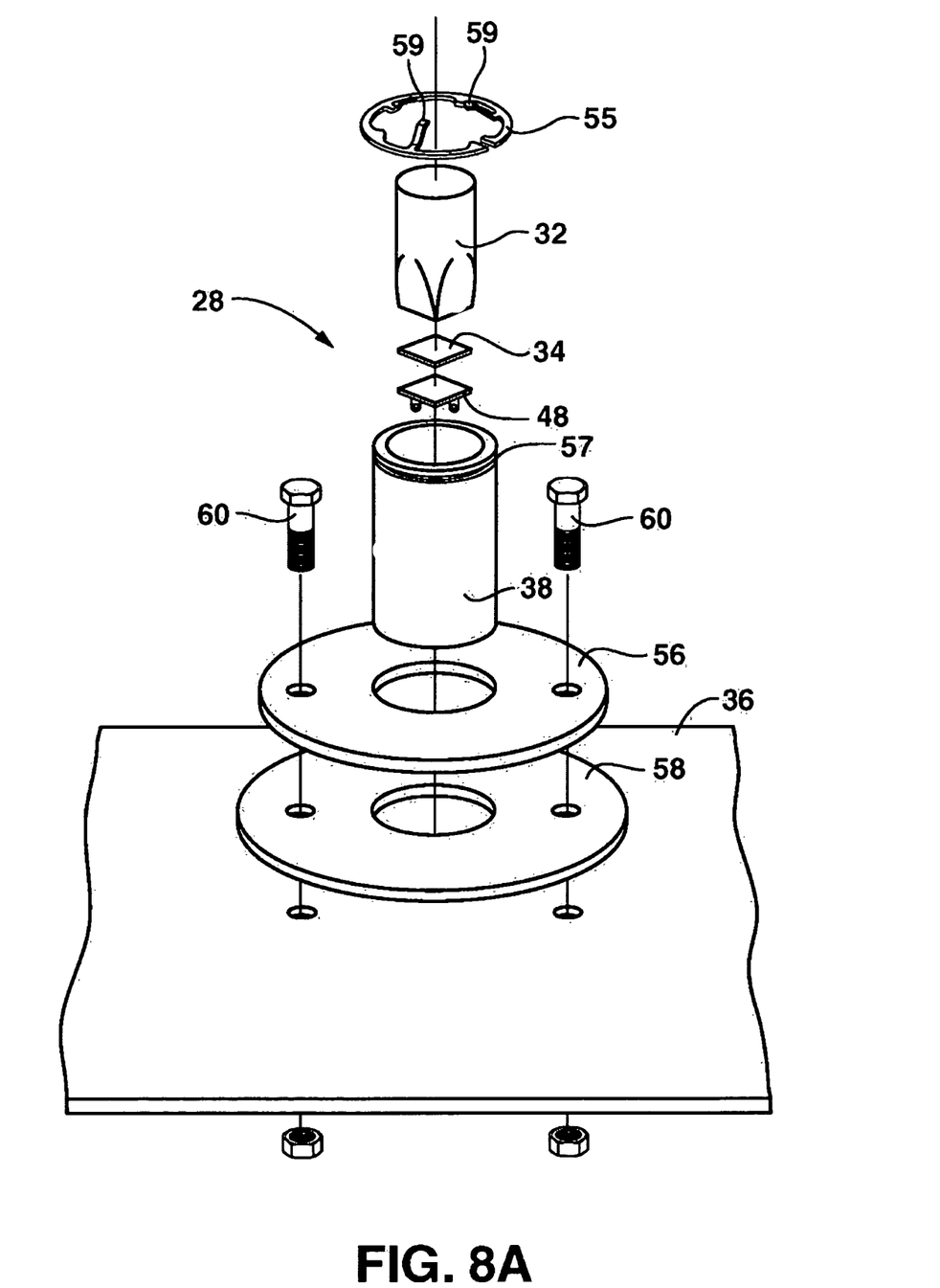
FIG. 8A provides an exploded perspective view of a first exemplary receiver assembly embodiment in accordance with aspects of the present invention.
Figure 8B:
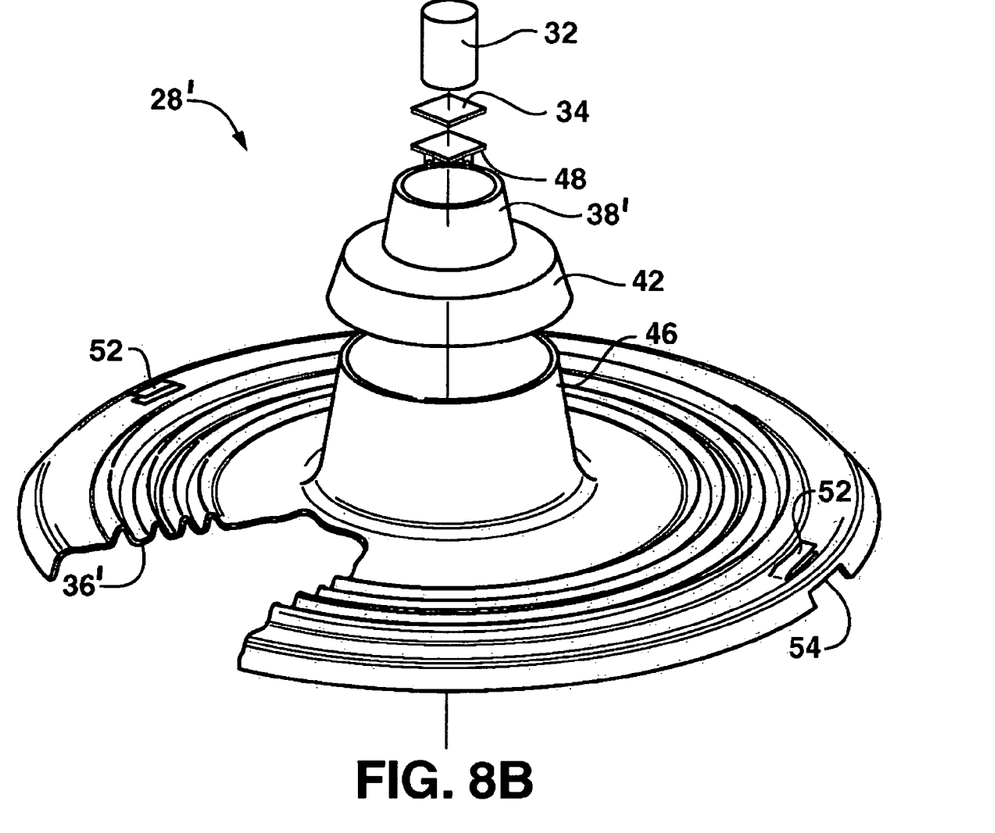
FIG. 8B provides an exploded and partially cutaway perspective view of a second exemplary receiver assembly embodiment in accordance with aspects of the present invention.

Additional description of the receiver assembly 28 will now be presented with respect to FIGS. 8A and 8B. A first exemplary receiver assembly embodiment 28, such as the one illustrated in FIG. 7, is presented in the exploded view of FIG. 8A. Referring to FIG. 8A, base plate 36 forms a relatively large square-shaped base for receiver assembly 28 in order to serve as a heat spreading element. In some exemplary embodiments, base plate 36 may be formed of phosphor-bronze or an aluminum alloy. A photovoltaic (PV) solar cell 34 is provided on an aluminum nitride substrate 48 which contains the connection points for the power wires. In one particular exemplary embodiment, PV cell 34 corresponds to a triple-junction concentrator cell such as manufactured and sold by Spectrolabs, Inc. PV cell 34 is configured to receive sunlight directed to the cell via optical rod 32, and produce a resultant electrical current flow based on an electrical field generated upon sunlight hitting the different layers in the cell 34. Optical rod 32 may be formed with a generally circular entrance that tapers to a smaller and generally square-shaped base. In one exemplary embodiment, the surface area of PV cell 34 measures about 100 mm$^2$. In one exemplary embodiment optical rod 32 measures about 29 mm in length, has a 19 mm diameter round entrance and a 9 mm by 9 mm square base.

Referring still to FIG. 8A, the cell 34, substrate 48 and power wires may be assembled then mounted in alignment tube 38 with and thermally bonded to a passive copper heat sink (not illustrated). In some embodiments when base plate 36 serves to dissipate enough heat or operation of the receiver assembly otherwise remains within predetermined thermal limits, an additional cooling element such as a heat sink may not be necessary. Passive cooling that keeps the cell temperature within or below a maximum range of 75-100 degrees-Celsius has been deemed appropriate for certain applications. Once the cell 34, substrate 48 and optical rod 32 are secured within alignment tube 38, a spring clip 55 is attached to the top of the assembly. Spring clip 55 is fitted into a circular groove 57 that is formed near an upper end of alignment tube 38 such that fingers 59 on the spring clip grab the edges of optical rod 32 and compress it onto the PV cell 34. Fingers 59 also provide a centering force because spring clip 55 is set just below the entrance face of optical rod 32.

An alternative embodiment 28' of a receiver assembly in accordance with the present invention is illustrated in FIG. 8B. Receiver assembly 28' of FIG. 8B includes several elements that are substantially the same as those described with respect to the receiver assembly 28 of FIG. 8A. In such instances, like reference numerals are used; prime designations are used to reference elements having at least some variation thereto. Receiver assembly 28' includes a base plate 36' that is formed as a spring plate having a concentric concertina spring stamped therein to provide a certain level of mechanical flexibility for reducing component stress. Such a spring design is seen in the partially cutaway view of FIG. 8B. Alignment tube 38' is formed with a stepped smaller diameter to form a shoulder 42 that contacts the bottom surface of primary mirror 22 when receiver assembly 28' is oriented through the pilot hole of the primary mirror. Alignment tube 38' is mounted to the raised center ridge 46 of spring plate 36' and may be physically mated thereto by an adhesive glue, bolting, friction fit, or other suitable connection means. A bayonet mount represented by tab elements 52 may be stamped into the spring plate 36'. Two or more of such tabs 52 can be provided to mate with slots in the back of the power unit housing. The spring loading will help ensure that mating between the tabs 52 and slots of the housing will not loosen. A specialized mounting tool may be employed to install or remove the receiver assembly by locking into slots 54 provided at one or more select locations around the periphery of spring plate 36'.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the spirit and scope of the present invention, which is more particularly set forth in the appended claims. Furthermore, those of ordinary skill in the art will appreciate that the foregoing description is by way of example only, and is not intended to limit the invention.

What is claimed is:

1. A power unit, comprising:
   a surface in a single plane covering the entire power unit;
   a curved primary mirror having a first perimeter defined by multiple full sections and multiple truncated sections provided in an alternating fashion, wherein at least portions of said multiple full sections are in direct physical contact with said surface and said multiple truncated sections are not in contact with said surface; and
   a secondary mirror having a second perimeter that is radially symmetric about a second axis, wherein said second perimeter is located between said surface and said curved primary mirror;
   wherein the primary mirror reflects solar radiation to the secondary mirror, and the secondary mirror reflects the majority of received solar radiation to a focal point.

2. The power unit of claim 1, wherein said first and second perimeters are characterized by respective first and second diameters, and wherein said first diameter is more than four times greater than said second diameter.

3. The power unit of claim 1, wherein said first and second perimeters are substantially coplanar.

4. The power unit of claim 3, wherein said first and second coaxial axes are substantially perpendicular to said surface.

5. The power unit of claim 1, wherein said first and second perimeters are both substantially circular.

6. The power unit of claim 1, wherein said first perimeter is defined by n full sections and n truncated sections provided in an alternating fashion, wherein each full section of said first perimeter is provided in contact with said surface, and wherein each truncated section is formed to define an arc extending away from said surface that exists in a respective plane perpendicular to said surface.

7. The power unit of claim 6, wherein n is an integer number between three and nine formed to define an arc extending away from said surface that exists in a respective plane perpendicular to said surface.

8. The power unit of claim 6, further comprising a plurality of mounting tabs, wherein each mounting tab is attached to a selected full section of said first perimeter to provide respective surfaces for contact with said surface.

9. The power unit of claim 1, wherein said secondary mirror is curved.

10. A solar panel, comprising:
    a front surface in a single plane covering an entire power unit;
    a plurality of power units, each power unit comprising first and second mirrors and a single receiver assembly;

wherein each said first mirror is defined by a first perimeter and a first curved area extending therefrom;

wherein said first perimeter is defined by multiple full sections and multiple truncated sections provided in an alternating fashion;

wherein at least portions of said multiple full sections of each of said first mirror are in direct physical contact with said front surface;

wherein each said second mirror is defined by a second perimeter and defined by a second curved area extending therefrom;

wherein the length of each said second perimeter is less than the length of each said first perimeter; and wherein each said second mirror is located between each said first mirror and said front surface.

11. The solar panel of claim 10, wherein the first and second perimeters of each said first and second mirrors are substantially circular and substantially coplanar, and wherein each said first and second mirrors in a given said power unit are radially symmetric about an axis substantially perpendicular to said front surface.

12. The solar panel of claim 10, wherein the first mirror of each power unit is formed to define a pilot hole therein, and wherein the receiver assembly of each said power unit is provided with an alignment feature that is oriented through the pilot hole of its respective first mirror.

13. The solar panel of claim 10, wherein the receiver assembly of each power unit further comprises: an optical rod for receiving solar radiation from the power unit's corresponding second mirror; and a photovoltaic cell provided at the base of said optical rod.

14. The solar panel of claim 13, further comprising an anti-reflective coating provided on at least a portion of each said optical rod.

15. The solar panel of claim 10, further comprising an anti-reflective coating provided on said front surface.

16. The solar panel of claim 10, wherein the first perimeter of each said first mirror is defined by n full sections and n truncated sections provided in an alternating fashion, wherein n is an integer number between three and nine.

17. The solar panel of claim 16, wherein the full sections of each said first perimeter are provided in contact with said front surface, and wherein each truncated section of each said first perimeter is formed to define an arc extending away from said front surface that exists in a respective plane perpendicular to said front surface.

18. The solar panel of claim 16, wherein the first perimeter of each said first mirror has at least two truncated sections that are respectively provided adjacent to a truncated section of the first perimeter of another power unit.

19. The solar panel of claim 10, wherein said solar panel is configured to provide a power output of at least about 500 Watts.

20. The power unit of claim 1, wherein the first perimeter has a near-square shape.

21. The power unit of claim 1, wherein the first perimeter has a near-hexagonal shape.

22. The power unit of claim 1, wherein the first axis of said curved primary mirror and the second axis of said secondary mirror are substantially coaxial.

23. The power unit of claim 1, further comprising a single receiver assembly comprising a photovoltaic cell.

24. The power unit of claim 1, further comprising a receiver assembly including a solar cell disposed behind an apex of the primary mirror.

* * * * *

UNITED STATES PATENT AND TRADEMARK OFFICE
CERTIFICATE OF CORRECTION

PATENT NO.        : 8,063,300 B2
APPLICATION NO.   : 11/138666
DATED             : November 22, 2011
INVENTOR(S)       : Horne et al.

It is certified that error appears in the above-identified patent and that said Letters Patent is hereby corrected as shown below:

On the Title Page, Item (73), on the Assignee line, please delete "SolFocus, Inc." and insert --H2GO, Inc.--.

Signed and Sealed this
Tenth Day of April, 2012

David J. Kappos
*Director of the United States Patent and Trademark Office*